(12) United States Patent
Birkmire et al.

(10) Patent No.: US 11,739,414 B2
(45) Date of Patent: *Aug. 29, 2023

(54) THERMAL EVAPORATION SOURCES FOR WIDE-AREA DEPOSITION

(71) Applicant: JLN Solar, Inc., Mill Valley, CA (US)

(72) Inventors: Robert W. Birkmire, Newark, DE (US); Gregory M. Hanket, Newark, DE (US)

(73) Assignee: JLN Solar, Inc., Mill Valley, CA (US)

( * ) Notice: Subject to any disclaimer, the term of this patent is extended or adjusted under 35 U.S.C. 154(b) by 22 days.

This patent is subject to a terminal disclaimer.

(21) Appl. No.: 16/863,866

(22) Filed: Apr. 30, 2020

(65) Prior Publication Data

US 2020/0292234 A1 Sep. 17, 2020

Related U.S. Application Data

(63) Continuation of application No. 15/645,927, filed on Jul. 10, 2017, now Pat. No. 10,663,228, which is a continuation of application No. 14/625,433, filed on Feb. 18, 2015, now Pat. No. 9,726,430, which is a continuation of application No. 12/250,172, filed on Oct. 13, 2008, now Pat. No. 8,986,455.

(60) Provisional application No. 60/998,640, filed on Oct. 12, 2007.

(51) Int. Cl.
*C23C 14/24* (2006.01)
*C23C 14/54* (2006.01)
*F27B 14/00* (2006.01)

(52) U.S. Cl.
CPC .......... *C23C 14/243* (2013.01); *C23C 14/543* (2013.01); *F27B 14/00* (2013.01)

(58) Field of Classification Search
CPC .................................................... C23C 14/243
See application file for complete search history.

(56) References Cited

U.S. PATENT DOCUMENTS

| | | | | |
|---|---|---|---|---|
| 5,222,074 A * | 6/1993 | Uchiyama | ............. | C23C 16/452 373/111 |
| 5,256,205 A * | 10/1993 | Schmitt, III | .......... | C23C 16/513 315/111.21 |
| 5,939,151 A * | 8/1999 | Prichard | .................. | H05H 1/48 118/723 VE |
| 2001/0011524 A1 * | 8/2001 | Witzman | .............. | C23C 14/562 118/724 |
| 2001/0054384 A1 * | 12/2001 | Povall | ..................... | C30B 31/22 118/723 R |
| 2004/0123804 A1 * | 7/2004 | Yamazaki | ............. | C23C 14/046 438/30 |
| 2004/0139914 A1 * | 7/2004 | Yamazaki | ............... | C23C 14/12 118/719 |
| 2005/0061251 A1 * | 3/2005 | Wei | ......................... | C23C 14/48 427/523 |
| 2006/0155557 A1 * | 7/2006 | Freeman | ................. | C23C 14/12 705/332 |

(Continued)

FOREIGN PATENT DOCUMENTS

KR 100848709 * 3/2007 .......... C23C 14/243

*Primary Examiner* — Keath T Chen
(74) *Attorney, Agent, or Firm* — K&L Gates LLP; Louis C. Cullman; Brian J. Novak

(57) ABSTRACT

A thermal evaporation sources are described. These thermal evaporation sources include a crucible configured to contain a volume of evaporant and a vapor space above the evaporant.

17 Claims, 4 Drawing Sheets

(56) References Cited

U.S. PATENT DOCUMENTS

| | | | |
|---|---|---|---|
| 2006/0223020 A1* | 10/2006 | Goetz | C23C 14/243 432/261 |
| 2007/0022956 A1* | 2/2007 | Bender | C23C 14/243 118/726 |

* cited by examiner

THERMAL EVAPORATION SOURCES FOR WIDE-AREA DEPOSITION

CROSS REFERENCE TO RELATED APPLICATIONS

This patent application is a continuation of U.S. patent application Ser. No. 15/645,927, filed Jul. 10, 2017, which is a continuation of U.S. patent application Ser. No. 14/625,433, filed Feb. 18, 2015, which is a continuation of U.S. patent application Ser. No. 12/250,172, filed Oct. 13, 2008, which claims priority benefit of U.S. Provisional Pat. Appln. No. 60/998,640, filed Oct. 12, 2007, each of which is incorporated herein by reference in its entirety.

STATEMENT REGARDING FEDERALLY SPONSORED RESEARCH

The U.S. Government has a paid-up license in this invention and the right in limited circumstances to require the patent owner to license others on reasonable terms as provided for by the terms of Contract No. ADJ-1-30630-12, awarded by the National Renewable Energy Laboratory.

BACKGROUND OF THE INVENTION

The high-vacuum deposition of thin films, such as Cu(In-Ga)Se$_2$, by thermal evaporation onto horizontally-oriented substrates which are spatially situated above the evaporation source (herein referred to as "vertical evaporation") is well known, and may be useful for forming absorber layers for photovoltaic devices. Generally speaking, a vertically-evaporating thermal evaporation source comprises a substantially closed vessel containing an evaporant, typically in liquid but possibly in solid form, with at least one effusion nozzle tunneling through the upper surface of the vessel through which the elemental vapor effuses. The relative simplicity of the effusion source design is one of the significant advantages of vertical evaporation.

However, a problem with vertical (i.e., upward) evaporation is that the substrate, in particular a rigid substrate, may only be supported at its edges to avoid either shadowing the substrate surface from deposition, or marring the substrate surface by physical contacting. The restriction of supporting the substrate at its edges can for some substrates limit the substrate temperature during deposition. One particular example is glass and more particularly soda-lime glass, where using an excessively high substrate temperature (such as in the vicinity of the softening point in the case of glass) can cause warpage or breakage of the substrate. This limiting of the substrate temperature may ultimately limit the desired properties of the deposited film, such as the photovoltaic conversion efficiency of Cu(InGa)Se$_2$ absorber layers on soda-lime glass, as it is well known that the photovoltaic conversion efficiency of solar cells utilizing Cu(InGa)Se$_2$ absorber layers typically increases monotonically with substrate temperature up to a temperature of approximately 550° C.

The most basic requirements of a thermal evaporation source are a volume comprising the elemental source material, and single or plural effusion nozzles to direct the elemental vapor, generated by the melt surface, from the source interior to the substrate. In the case of a vertically-evaporating source, the effusion nozzles will ideally be within close proximity to and axially oriented normal to the melt surface. In the simplest designs, the effusion nozzles will be aimed vertically and located directly above the melt surface, as illustrated in FIG. 1. FIG. 1 shows a prior art vertical evaporating source 30 with effusion nozzles 36 passing through heat shielding 22 and situated directly above and in close proximity to the surface of evaporant material 14. The substrate to be coated is indicated at 26. The device also comprises an evaporation chamber 18 and a containment box 12.

It is desirable to minimize the external surface area of the source in order to minimize the thermal load. Further, it is desirable to minimize the aspect ratio of the source (the ratio of the major dimension to the minor dimension, upon viewing the surface of the evaporant, so as to maximize temperature uniformity within the source. A non-uniform melt temperature results in variations in vapor pressure above the melt, causing variations in effusion rate through the nozzles, ultimately contributing to non-uniform film thicknesses on the substrate. Further hindering uniform deposition is the fact that the temperature profile of the source may be expected to change as depletion of the elemental source material occurs, thereby further reducing thermal conductance along the major axis and reducing deposition uniformity. A potential remedy to the problems exhibited by the configuration in FIG. 1 is the configuration described by Baron et al (U.S. Pat. No. 4,401,052), in which a separate low-aspect-ratio melt chamber is heated to generate a vapor of the evaporant from a substantially isothermal evaporant surface. This vapor is then directed into a manifold and out through multiple effusion nozzles to the substrate. A problem with this configuration is that in the case of evaporants which require very high temperatures for sufficient vapor generation, the large surface area of this configuration may result in an unacceptably high thermal loading. Furthermore, the actual physical fabrication of this design is challenging.

SUMMARY OF THE INVENTION

The invention provides a thermal evaporation source that includes:

a crucible configured to contain a volume of evaporant and a vapor space above the evaporant;

a manifold body having within it a hollow expansion chamber that is flowably connected to the vapor space via one or more restriction orifices;

one or more effusion nozzles flowably connected to the expansion chamber and exiting an outer surface of the thermal evaporation source, the nozzle(s) oriented to direct an evaporant vapor flow out of the source vertically downward, in one or more horizontal directions, or in one or more directions intermediate between horizontal and vertically downward; and a heater capable of heating some or all of the thermal evaporation source to a temperature sufficient to produce the one or more evaporant vapor flows when a vacuum is applied to the thermal evaporation source.

DETAILED DESCRIPTION OF THE INVENTION

The present invention provides evaporation sources for high-vacuum deposition onto linearly-translating, wide-area substrates, where "wide-area" refers to the requirement of multiple effusion point sources to achieve uniform deposition across the width of the substrate as the substrate moves relative to the evaporation source, with the widthwise direction being defined as perpendicular to the direction of translation. The devices and methods of this invention may be applied to vacuum thin film deposition in general, with one particularly useful application being the formation of chalcopyrite based thin films for photovoltaic applications.

Compared with other designs, the disclosed configurations offer excellent control, higher areal throughput, and relative insensitivity to debris from accumulated unutilized evaporant materials. In some embodiments, they allow the use of higher substrate temperatures, which in turn allows more efficient operation of the resultant photovoltaic modules. Specific configurations disclosed also allow improved controllability, doubled areal throughput, or mitigation of dislodged debris that may disturb the process.

Compared with vertical evaporation, when considering downwards- or sideways-evaporating sources, the fundamental source configuration changes in that the nozzle axis cannot be situated above the melt surface and aligned normally to it.

The invention discloses a series of configurations for downwards-evaporating and sideways-evaporating sources. Substrate situations intermediate between that of "downwards evaporation" and "sideways evaporation" may also be used, according to the invention.

Sideways-Evaporating Source

Figure 2:
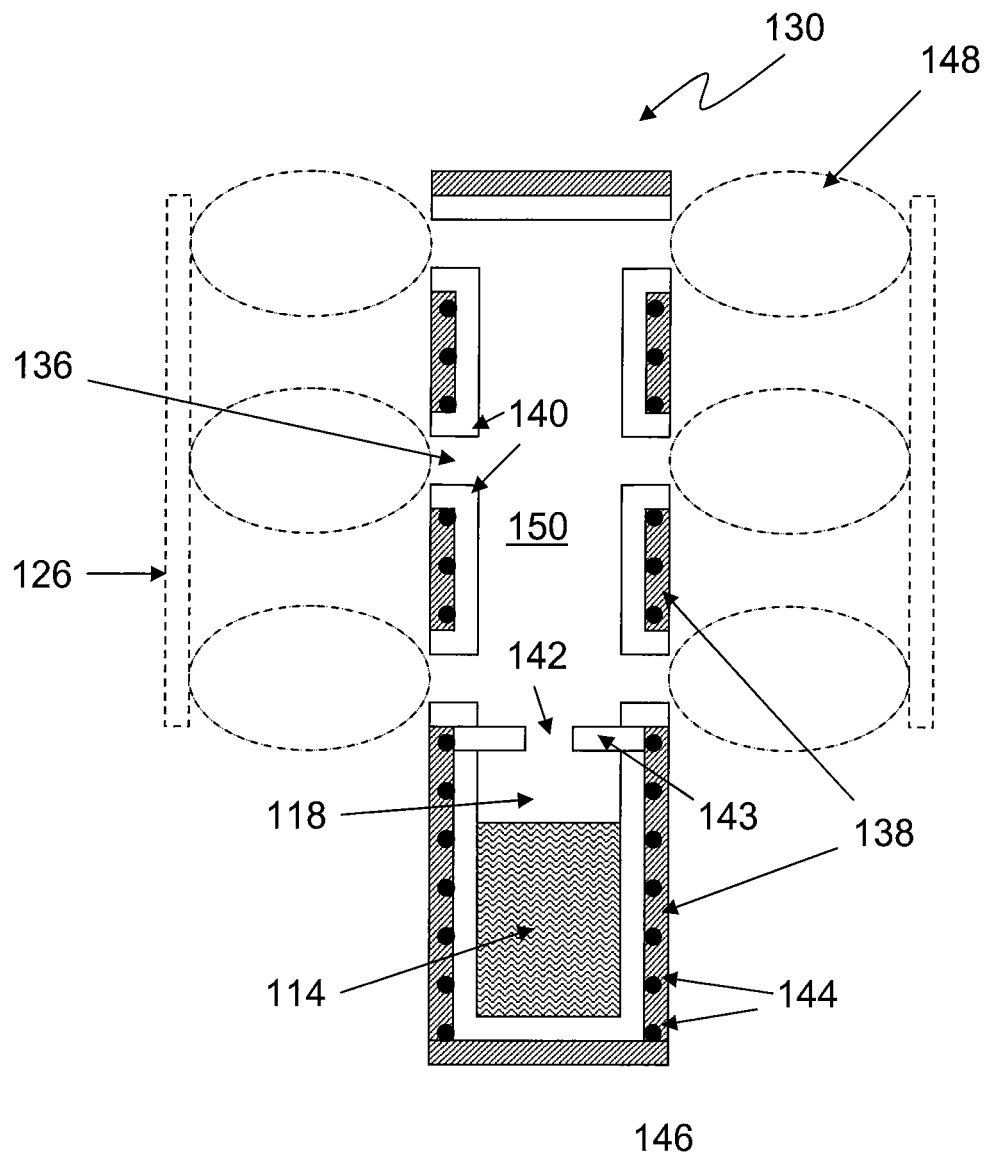
FIG. 2 is a cross-sectional side view of a sideways-evaporating effusion source according to the invention.

FIG. 2 shows a cross-sectional side view of one possible configuration of a sideways-evaporating effusion source 130 capable of simultaneously depositing on two wide-area substrates 126, according to the invention. Viewed from the top, the cross-section of the source 130 may be circular or square. In the case where the cross-section is circular, the source 130 may comprise a threaded lid and body (not shown) for ease of charging evaporant 114.

The device includes a volume of evaporant 114 contained in a crucible 146, which also contains a vapor space 118 above the evaporant. Vapor from vapor space 118 enters an expansion chamber 150 enclosed within a manifold body 140, with the restriction orifice so that the net vapor flow into the manifold is upwards and normal to the evaporant 114 surface. Optionally, an internal restriction orifice 142 may be formed in a crucible lid 142, the function of which is to cause the evaporant 114 vapor pressure in the expansion chamber to be less than the thermodynamic saturation pressure of the evaporant 114, thereby inhibiting evaporant 114 condensation within the manifold body or in the effusion nozzles 136.

A heating element 144 (typically unitary) heats some or all of the assembly. There may be a single heating element, or two or more may be used. For example, one element may primarily heat the manifold while another primarily heats the crucible 146 containing evaporant 114 volume. Or, one element may heat the crucible and evaporant while multiple elements heat the manifold. Heating element 144 may be either spiral-wound around the perimeter of the source 130, or serpentine with the straight runs of the heating element oriented vertically. Alternatively a number of single, straight heating elements, oriented vertically, may be disposed around the perimeter of the source 130. Other configurations are also acceptable according to the invention. One exemplary heating element material known in the art is graphite, and if necessary it may be electrically insulated from the body of the evaporation source with a high-temperature electrical insulator such as boron nitride.

One or more effusion nozzles 136 are situated on a single face of the manifold body, or on two opposite faces (if the source 130 has a square cross-section) or diametrically opposed (If circular) as in FIG. 2. In the case of multiple effusion nozzles 136 per face (e.g., three on each of 2 faces as shown in FIG. 2), the effusion nozzles may progressively increase in size (not shown in FIG. 2) with distance from the manifold entrance, in order to compensate for the vapor pressure drop along the length of the manifold. In some embodiments, the effusion nozzles 136 are of the conical nozzle design disclosed in U.S. Pat. Nos. 6,982,005 and 6,562,405, the entire disclosures of which are incorporated herein by reference. An effusion plume 148 of evaporant vapor exits the effusion nozzles and is deposited on the substrate(s) 126.

During operation, the manifold is maintained at a temperature above the saturation point of the vaporized evaporant 114 within the manifold to prevent condensation. An insulating layer 138 typically surrounds substantially the entire assembly with the exception of the effusion nozzle(s) 136 and electrical feed-throughs for the heating element(s) 144.

The evaporant may be any element, or compound thereof, that is known in the art for high-vacuum deposition in forming a photovoltaic absorber layer. Nonlimiting examples include copper, indium gallium and selenium. In use, substrate 126 translation direction is normal to the plane of the page.

Generally speaking, in order to minimize the surface-area-to-volume ratio of the source 130, the source 130 should be cylindrical in geometry; i.e., circular in cross-section when viewed from the top. The crucible 146 may have a larger circumference than the manifold, as prolonged operating duration may be achieved by increasing the volume of the evaporant 114 chamber. Simultaneously, the circumference of the manifold should be limited in order to reduce the thermal loading of the source 130, while still maintaining sufficient internal vapor conductance along the interior of the manifold to avoid an excessive vapor pressure drop. These design considerations do not limit the source 130 design to cylindrical designs. Other considerations such as the method of heating may also factor into the choice of source 130 geometry, such as a square or rectangular perimeter instead of a circular perimeter. Furthermore, the present invention is not limited to low-aspect-ratio cross sections. High-aspect-ratio cross sections, with large perimeter-to-area ratios, may also be used.

An advantage of sideways evaporation is that debris, comprising unutilized evaporant 114 materials condensed on the stationary internals of the deposition system, cannot fall onto the substrate 126 surface or into the evaporation source 130 nozzles 136. A deposition configuration whereby the substrates 126 are situated in a vertical configuration ("sideways evaporation") also allows the possibility of increased substrate 126 temperatures, because sagging of the substrate 126 is reduced by this orientation compared with a horizontal one.

Downwards-Evaporating Single-Nozzle Source

A downwards-evaporating configuration allows the substrate to be supported across its entire width, not just at the edges as in the case of vertical evaporation described previously. Therefore, the potential for deposition at higher substrate temperatures is one advantage, among others, in evaporating downwards from the source onto the upward-facing surface of the substrate ("downwards evaporation"), particularly when the substrate is glass. This in turn allows higher temperatures since the corresponding softening of the glass is mitigated by the greater area of support.

A number of downwards-evaporating-source configurations are hereby disclosed. One embodiment of a downwards-evaporating source according to the invention is a single nozzle source 230, depicted in FIG. 3A as viewed from the side in cross-section. It employs an open vessel or substantially closed chamber containing the evaporant 214 volume and a vapor space 218 above it. The crucible 246 is suspended inside an expansion chamber 250 enclosed within a manifold body 240. The geometry of the source 230 is typically cylindrical, i.e., having a circular cross section as viewed from the top, but it may also have other shapes, including for example square or rectangular. The crucible is centered laterally. Thus, in the case where the effusion source has a circular cross section, the crucible forms an annulus with the inside walls of the manifold body.

Underneath the bottom surface of the evaporant 214 volume, a downwards-aiming nozzle 236 directs the vapor out of the manifold towards the substrate 226 (not shown), which is situated below the source 230. The design of the downwards-aiming nozzle 236 may be that described in U.S. Pat. Nos. 6,982,005 and 6,562,405, but other designs know in the art may also be used. The source 230 is typically heated from the outside surface of the manifold, in most cases by a spiral wound heating element 244 but also possibly by a serpentine heating element or a plurality of straight, vertically-oriented heating elements disposed about the circumference of the source 230. Insulation 238 surrounds the device.

Figure 3A:
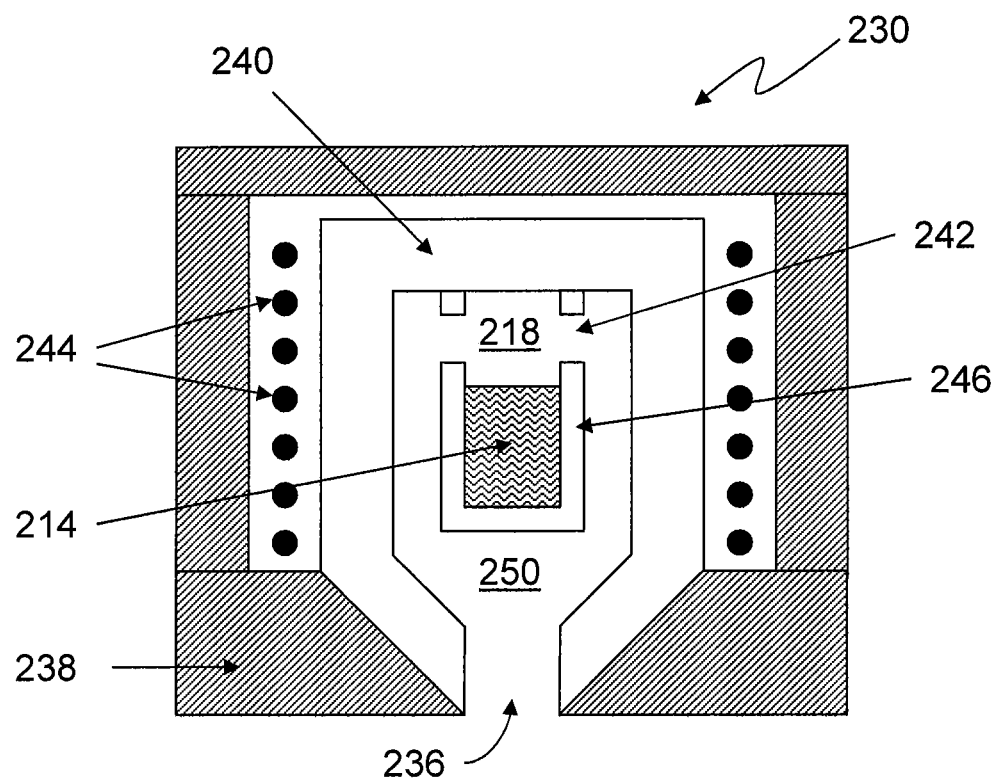
FIGS. 3A and 3B are cross-sectional side views of a single-nozzle downwards-evaporating sources according to the invention.
Figure 3B:
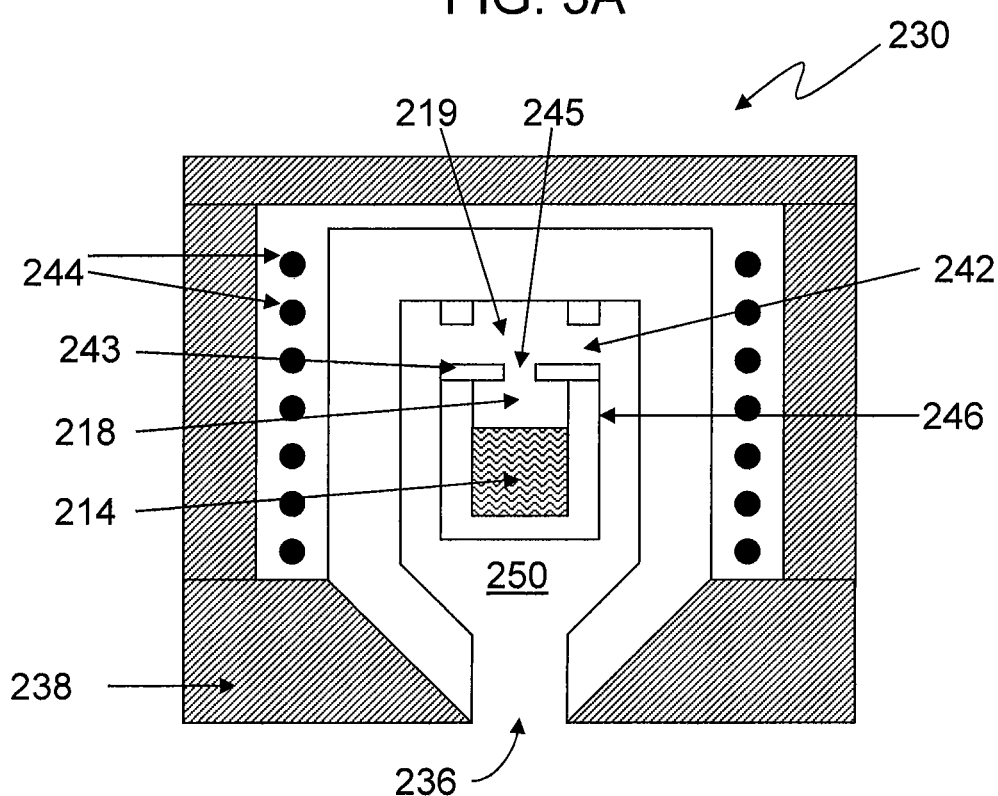

This particular configuration offers a number of advantages in operation. First, by heating the outer walls of the manifold, the manifold will be maintained at a higher temperature than the melt, thereby inhibiting condensation in the manifold. Second, by suspending the base of the crucible 246 above the effusion nozzle 236, the evaporant 214 volume will be cooled by radiant emission through the effusion nozzle 236. This will further reduce the temperature of the evaporant 214 volume and further inhibit condensation within the manifold. In some embodiments, the evaporant 214 volume is suspended from the top surface of the source 230. The mechanical members which accomplish the suspension of the crucible 246 may be designed to permit either a high or low vapor flow conductance from the evaporant 214 volume to the manifold. For example, as shown in FIGS. 3A and 3B, the crucible 246 may have the shape of a tube with a closed bottom, with the tube being suspended from and attached or sealed to the manifold and having restriction orifices 242 through which vapor can exit the crucible 246 and enter the manifold interior.

The restriction orifice serves to reduce the vapor concentration (and thus, the saturation temperature) of evaporant in the manifold and also ultimately at the nozzle. Proper sizing of the restriction orifice prevents condensation of evaporant on or In the nozzle, which is suffers considerable radiative heat loss and is therefore typically the coolest structure in contact with the evaporant vapor. Restriction orifices may also be used in any other embodiment of the invention. FIG. 3B shows a variation on the design shown in FIG. 3A, including a crucible lid 243 that incorporates one or more additional restriction orifices 245 to provide an added expansion space 219 that affords an added increment of vapor concentration control. Only one such additional restriction orifices is shown in lid 243 in FIG. 3B, but any number may be used. Although FIGS. 3A and 3B depict crucible 246 with a flat bottom, the shape may differ from that and may for example be tapered downward so as to accommodate a larger volume of evaporant 214.

To achieve wide-area deposition, plural single-nozzle 236 source 230s described above may be disposed across the width of the substrate 226. The control of an individual source 230 in the cross-substrate 226 array may be achieved by disposing a number of composition sensing points equivalent to or greater than the number of single-nozzle 236 source 230s across the substrate 226, and then; 1) mathematically deriving the effusion rates of the individual source 230s from the composition sensor measurements, and 2) modifying power to the individual heating elements of the source 230s accordingly to achieve the desired composition across the width of the substrate 226.

The physical dimensions of effusion source 230 can vary according to the particular needs of a given application. In some embodiments, the overall diameter of the source may be in a range of about 10-14 Inches (about 25-36 cm) and the height may be in a range of about 11-16 Inches (about 28-41 cm). The nozzle 236 may typically be in a range of about 2-6 cm, and more typically about 4 cm. Typical dimensions for the crucible 246 are about 14 cm outside diameter, 12 cm inside diameter, and a height sufficient to contain a pool of evaporant about 15 cm high. There may be any number of restriction orifices 242 spaced around the circumference of the crucible. Typically, the number is at least three and at most twenty, for example eight such orifices each with a diameter of 2 cm. The inside diameter of manifold body 240 is typically set to provide about a 2 cm annulus gap with the crucible.

Downwards-Evaporating Multiple-Nozzle Source

Figure 4:
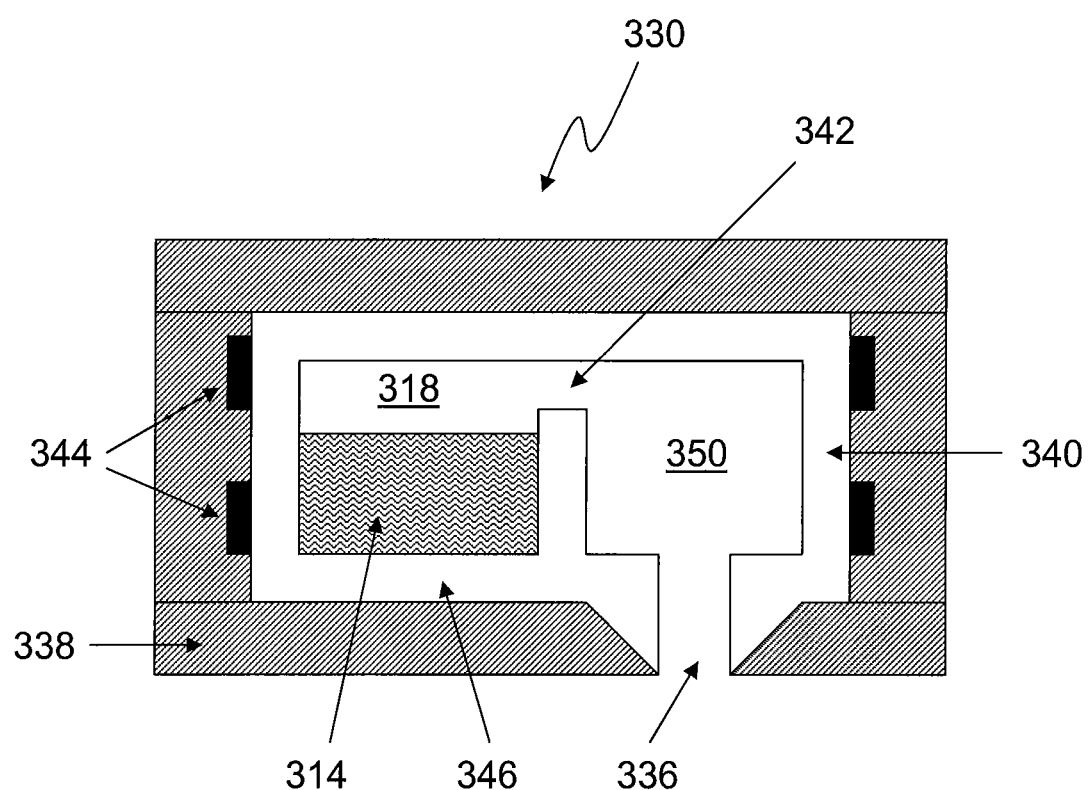
FIG. 4 is a cross-sectional side view of a multiple-nozzle, downwards-evaporating source according to the invention.

An alternate means of achieving wide-area deposition by downwards evaporation is by a multiple-nozzle source comprising an crucible 346 disposed to the side of an expansion chamber. FIG. 4 shows a cross-sectional side view of a multiple-nozzle, downwards-evaporating source 330 of this sort, according to the invention. Multiple nozzles 336 (only one is visible in FIG. 4) are disposed along the axis normal to the plane of the page, all typically exiting from a single expansion chamber 350. The source is rectangular in cross-section when viewed from above, of unitary construction and formed from a single block of material. In use, translation of the substrate (not shown) Is right-to-left or left-to-right.

Figure 1:
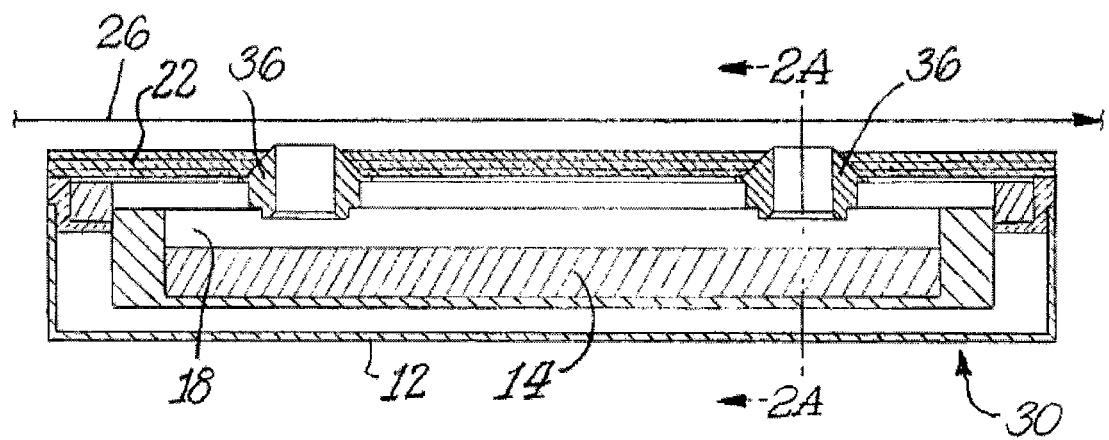
FIG. 1 is a cross-sectional side view of a prior art vertical evaporating source.

One or more restriction orifices 342 through the wall separating the crucible 346 from the expansion chamber 350 allow vaporized evaporant 314 to flow from the crucible into the expansion chamber. The manifold body 340 that surrounds the expansion chamber is contiguous with the crucible 346. Insulation 338 surrounds the device. The restriction orifice(s) may be of any shape, for example circular or in the shape of a long slot running in a direction from front to back as viewed in FIG. 4. The flowing vapor is directed from the crucible 346 downwards to the substrate (not shown) by way of the effusion nozzles 336, for example according to the nozzle design disclosed in U.S. Pat. Nos. 6,982,005 and 6,562,405. By appropriately sizing the restriction orifice(s) 342, the pressure of the vapor within the expansion chamber 350 may be reduced to inhibit condensation within the expansion chamber. A further advantage of the configuration shown in FIG. 4 is that temperature-Induced vapor pressure variations above the surface of the melt that would otherwise cause effusion non-uniformities in source configurations such as that shown in FIG. 1, may be mitigated by lateral vapor flow within the expansion chamber 350.

The source 330 is heated typically by a plurality of heating elements 344 oriented along the major axis (i.e. across the substrate 326 width), and located on either side of the source 330. It is desirable to minimize thermal gradients between the top and bottom of the source 330. If the bottom of the source 330 becomes too hot in relation to the top of the source 330, boiling or spitting of the evaporant 314 may occur. If the bottom of the source 330 becomes too cool in relation to the top, condensation about the effusion nozzle 336 may result in condensed evaporant 314 falling onto the substrate through nozzle 336. Suitable adjustment of the heating elements should therefore be made to maintain sufficient temperature uniformity. Access to the interior of source 330 for purposes of charging evaporant to the crucible may be by one or more threaded ports and plugs (not shown) on the upper surface of the source, and this may similarly be used for any embodiment of the invention.

Methods of Construction

The manifolds and crucibles of evaporation sources according to the invention are typically constructed from graphite or boron nitride, although other materials may be used. Materials of construction should be impervious to and non-reactive with the evaporant material at the temperatures of use, and should remain solid and structurally strong at such temperatures. Temperatures are typically in a range from 1000 to 1600° C.; however, the use of high vapor pressure evaporants such as selenium, which would be expected to evaporate at temperature between 300-600° C., is not precluded.

To avoid vapor leakage through joints between disparate elements from which the source is constructed, all joints typically will be threaded, with flat mating surfaces to provide a good seal. Optionally, joints may be fabricated with either knife edge or flush mating surfaces and utilize a high temperature gasket material, for example a graphite foil sold under the trade name GRAFOIL® by GrafTech International of Parma, Ohio.

In the case of the sideways-evaporating source, a threaded joint may be utilized to join the manifold and the crucible in a semi-permanent fashion. Additionally, it may be desirable to incorporate a threaded plug at the top of the manifold so that the evaporant may be dropped into the source for replenishing without substantially disassembling the source.

In the case of the single-nozzle downwards-evaporating source, the crucible should drop down into the top of the manifold and screw into place so that it is fixed in a semi-permanent fashion. Additionally, a threaded plug should be incorporated into the top surface of the crucible for adding evaporant to the source.

In the case of the multiple-nozzle downwards-evaporating source, fabrication requires the drilling of multiple internal holes in a solid billet of material. The crucible and expansion chamber may be fabricated by drilling through the entirety of the length of the billet. The ends of these chambers may then be closed off by threading and installing permanent plugs. Likewise, forming the plurality of pathways between the crucible and the expansion chamber requires first drilling through an external wall of the source (either the evaporant or expansion sides) to access the surface of the internal separating wall, continuing on through the internal separating wall, removing the drill, and then threading and plugging the resultant holes in the external wall of the source in a permanent fashion. Finally, a removable threaded plug or plugs should be incorporated in the top surface above the crucible for replenishing the evaporant.

The heating elements may be a refractory metal, preferably tantalum, or less desirably tungsten, or graphite. Considerations such as the form (spiral wound, serpentine, etc.) and difficulty of fabrication assist in determining whether a refractory metal or graphite are preferably used.

The insulation may be either a thick rigid sheet of a low-density ceramic material, an example being alumina-based foam insulation sold by Zircar ceramics. Alternately, insulation may comprise a plurality of radiation shields. Radiation shields may comprise a metal foil, graphite foil, or thin ceramic sheet.

Although the invention is illustrated and described herein with reference to specific embodiments, the invention is not intended to be limited to the details shown. Rather, various modifications may be made in the details within the scope and range of equivalents of the claims without departing from the invention.

We claim:

1. A thermal evaporation source comprising:
   a manifold body including an expansion chamber, a nozzle, and a general sloping shape narrowing from the expansion chamber toward the nozzle;
   a crucible having a circumference configured to contain a volume of evaporant and suspended from a top internal surface of the manifold body within the expansion chamber above the nozzle, wherein mechanical members suspend the crucible from the top internal surface and thereby form at least one restriction orifice,
   the expansion chamber is a space between the crucible and the manifold body; and
   wherein the at least one restriction orifice comprises at least three orifices evenly spaced around the circumference of the crucible,
   each of the at least three orifices are at a same distance from the top internal surface of the manifold.

2. The thermal evaporation source of claim 1, wherein the expansion chamber is circular in cross-section.

3. The thermal evaporation source of claim 1, further comprising a heater capable of heating the thermal evaporation source to a temperature of between 300° C. and 1,600° C.

4. The thermal evaporation source of claim 1, wherein the crucible is a formed of boron nitride.

5. The thermal evaporation source of claim 1, wherein the crucible is a formed of graphite.

6. The thermal evaporation source of claim 1, wherein the at least one restriction orifice comprises eight orifices evenly spaced around the circumference of the crucible.

7. The thermal evaporation source of claim 1, wherein the manifold body is formed of graphite.

8. The thermal evaporation source of claim 1, wherein the crucible includes a tapered bottom.

9. The thermal evaporation source of claim 8, wherein the tapered bottom slopes toward the nozzle.

10. The thermal evaporation source of claim 1, wherein a gap exists between the crucible and the manifold body.

11. The thermal evaporation source of claim 10, wherein the gap is at least about 2 cm.

12. The thermal evaporation source of claim 1, wherein the nozzle has a diameter of between about 2 cm and about 6 cm.

13. The thermal evaporation source of claim 1, wherein the crucible has a circular cross-section.

14. The thermal evaporation source of claim 13, wherein the crucible has an internal diameter of about 12 cm.

15. The thermal evaporation source of claim 1, wherein the crucible is configured to hold a pool of the evaporant of about 15 cm in depth.

16. The thermal evaporation source of claim 1, wherein the nozzle is oriented to direct a vapor flow out of the thermal evaporation source vertically downward, in one or more horizontal directions, or in one or more directions intermediate between horizontal and vertically downward.

17. The thermal evaporation source of claim 1, wherein the nozzle is configured to produce a vertically downward vapor flow.

* * * * *